US006939769B2

(12) United States Patent
Oh (10) Patent No.: US 6,939,769 B2
(45) Date of Patent: Sep. 6, 2005

(54) METHOD FOR MANUFACTURING A SEMICONDUCTOR DEVICE WITH USING DOUBLE IMPLANTING BORON AND BORON DIFLUORIDE

(75) Inventor: Jae-Geun Oh, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 37 days.

(21) Appl. No.: 10/138,556

(22) Filed: May 6, 2002

(65) Prior Publication Data

US 2003/0003668 A1 Jan. 2, 2003

(30) Foreign Application Priority Data

Jun. 30, 2001 (KR) ........................................ 2001-38758

(51) Int. Cl.[7] ............................................. H01L 21/336
(52) U.S. Cl. ...................... 438/301; 438/202; 438/205; 438/657
(58) Field of Search ..................... 438/590, 301–305, 438/365, 207, 522, 647, 657, 313, 322, 323, 202, 205; 257/756, 265, 554, 370, 367, 24, 369

(56) References Cited

U.S. PATENT DOCUMENTS

| | | | | |
|---|---|---|---|---|
| 5,077,226 A | * | 12/1991 | Youn et al. | ................. 438/207 |
| 5,225,357 A | * | 7/1993 | Ho | ............................. 432/30 |
| 5,763,920 A | * | 6/1998 | Momuro | ..................... 257/370 |
| 6,569,742 B1 | * | 5/2003 | Taniguchi et al. | .......... 438/303 |

FOREIGN PATENT DOCUMENTS

KR          1999-57331         7/1999

OTHER PUBLICATIONS

Parab et al., "Detailed analysis and computaitnally efficient modeling of ultra shallow as implanted rofiles obtained by low energy BBF2, and As ion implantation", IEEE, pp. 559–562, 1997.*

Tasch et al., "Experimental Observations and Modeling of Ultra–Shallow BF2 and As Implants In Single Crystal Silicon", JVS. Technology B 12 (1), Jan./Feb. 1994, pp. 166–171.*

Parab et al., "Detailed Analysis and Computationally Efficient Modeling of Ultra Shallow Dopant Profiles Obtained by Low Energy B/BF2 and As Ion Implantation", IEEE, 1997, pp. 559–562.*

Notice of Preliminary Rejection from the Korean Intellectual Property Office dated May 26, 2003, 2 pages, with English translation (1 page).

English abstract for KR 1999–57331, 1 page.

* cited by examiner

Primary Examiner—Carl Whitehead, Jr.
Assistant Examiner—Yennhu B. Huynh
(74) Attorney, Agent, or Firm—Finnegan, Henderson, Farabow, Garrett & Dunner, L.L.P.

(57) ABSTRACT

The present invention provides a method for manufacturing a semiconductor device capable of acquiring productivity when a p-type source/drain is formed by the implantation of a $BF_2$ and B ions. The method for manufacturing a semiconductor device includes the steps of: implanting a $BF_2$ ion in a p-type source/drain region on a silicon substrate with an ion implantation energy of from about 10 keV to about 20 keV; implanting B ion in the p-type source/drain region with an ion implantation energy of from about 5 keV to about 10 keV; and forming a p-type source/drain by carrying out a thermal treatment.

2 Claims, 8 Drawing Sheets

FIG. 6B $^{49}BF_2 / {}^{11}B$ ION INJECTION

FIG. 7

| ION INJECTION CONDITION OF P+ SOURCE/DRAIN | | | POST THERMAL TREATMENT | |
|---|---|---|---|---|
| | | | AFTER SOURCE/DRAIN RTP | AFTER PROCESS COMPLETION |
| BF2 ONLY ION INJECTION (20keV, 2E15) | | Rs map | | |
| (PRIOR ART 1) | 5901 TW | Rs | 73.6 | 78.2 |
| | 0.15% | % | 2.0 | 1.6 |
| BF (20keV, 1E15) +B (4.5keV, 1E15) | | Rs map | | |
| (PRIOR ART 2) | 5075 TW | Rs | 66.6 | 69.3 |
| | 0.14% | % | 1.4 | 1.0 |
| $BF_2$(20keV, 1E15) +B (5keV, 1E15) | | Rs map | | |
| (PRESENT INVENTION) | 5142 TW | Rs | 66.6 | 69.4 |
| | 0.16% | % | 1.0 | 0.8 |

FIG. 8

METHOD FOR MANUFACTURING A SEMICONDUCTOR DEVICE WITH USING DOUBLE IMPLANTING BORON AND BORON DIFLUORIDE

FIELD OF THE INVENTION

The present invention relates to a semiconductor manufacturing technology; and, more particularly, to a method for forming p⁺ source/drain region of a metal oxide semiconductor (MOS) transistor.

PRIORITY

This application claims the benefit of priority of corresponding Application No. 2001-38758, filed Jun. 30, 2001, Republic of Korea, the contents of which are incorporated herein by reference in their entirety.

DESCRIPTION OF THE PRIOR ART

Metal oxide semiconductor (MOS) transistors find widespread use in semiconductor devices, especially in semiconductor memory. The fabrication process of MOS transistors affects their operational characteristics, and the operational characteristics of the devices of which they are a part.

Figure 1A:
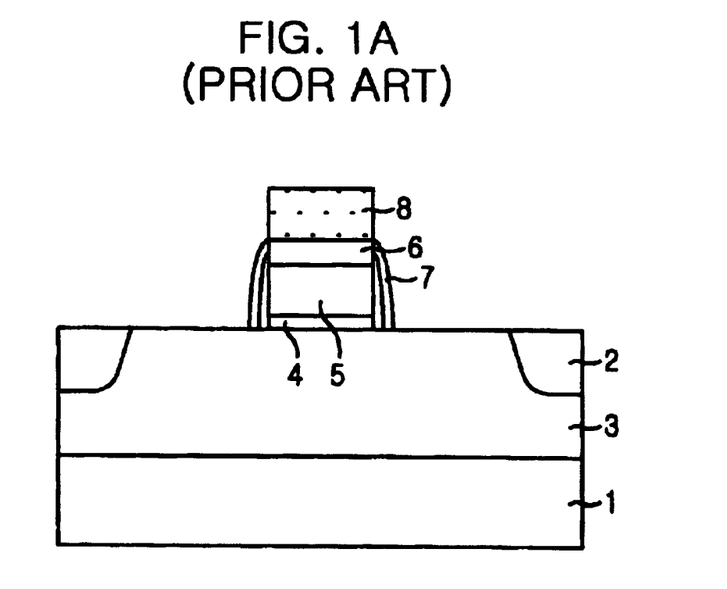
FIGS. 1A and 1B are cross-sectional views illustrating a conventional method for manufacturing a metal oxide semiconductor (MOS) transistor of semiconductor device.

One aspect of MOS transistor fabrication having an influence on MOS transistor performance is the ion implantation process used to form the source/drain regions. Methods for forming source/drain regions using conventional ion implantation processes include those depicted in FIGS. 1A and 1B. Referring to FIG. 1A, a device isolation layer 2 is formed on a silicon substrate 1 by carrying out a shallow trench isolation (STI) process. Then, a P-well (not shown) and a n-well 3 are formed on the silicon substrate 1 by high energy ion implantation, and a gate oxide layer 4 and a gate electrode 5 are formed by carrying out a gate formation process. Next, a mask oxide layer 6 is formed on a upper portion of the gate electrode 6, and a spacer 7, consisting of an oxide layer and a nitride layer, are formed on sidewalls of the gate electrode 5. Reference numeral 8 denotes a photoresist pattern.

Figure 1B:
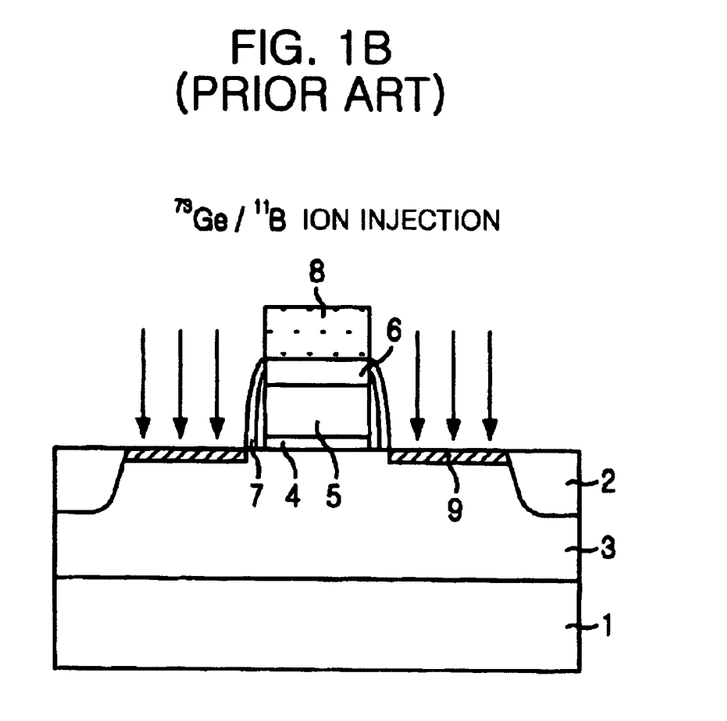

Referring to FIG. 1B, $^{73}Ge$ ions are implanted in the p⁺ source/drain region using the photoresist pattern 8 as an ion implantation mask for forming an amorphous layer, and then $^{11}B$ ions are implanted. Subsequently, the photoresist pattern 8 is removed, and n⁺ source/drain is formed.

Subsequently, p⁺ source/drain 9 is formed through a predetermined thermal treatment. In the process forming the p⁺ source/drain, an implantation of $^{73}Ge$ is carried out to form an amorphous layer for preventing channeling phenomena caused by an ion implantation. Recently, instead of $^{11}B$ ion, a $^{49}BF_2$ ion having large molecular weight is used as a dopant, so the implantation of $^{73}Ge$ for forming the amorphous layer can be omitted.

Such processes advantageously reduce contact size. Unfortunately, in ultra-high integration of semiconductor devices, contact resistance in the bit line and/or the metal contacts increases as contact size decreases. To reduce contact resistance, additional ions can be implanted to the source/drain region. This is because the solid solubility of B ions is lower than that of $^{31}P$ and $^{75}As$ by about one order of magnitude at a given temperature. Also, $^{49}BF_2$ ions are implanted partially in order to more effectively reduce the contact resistance. But, due to the low solid solubility of a $^{11}B$ ion to silicon, these improvements are hampered. Also, $^{49}BF_2$ ion implantation tends to increase leakage current by introducing so-called end of range (EOR) defects.

Also, the p⁺ source/drain ion implantation and an additional $^{49}BF_2$ ion implantation brought out the EOR defect to a p⁺ source/drain.

Figure 2:
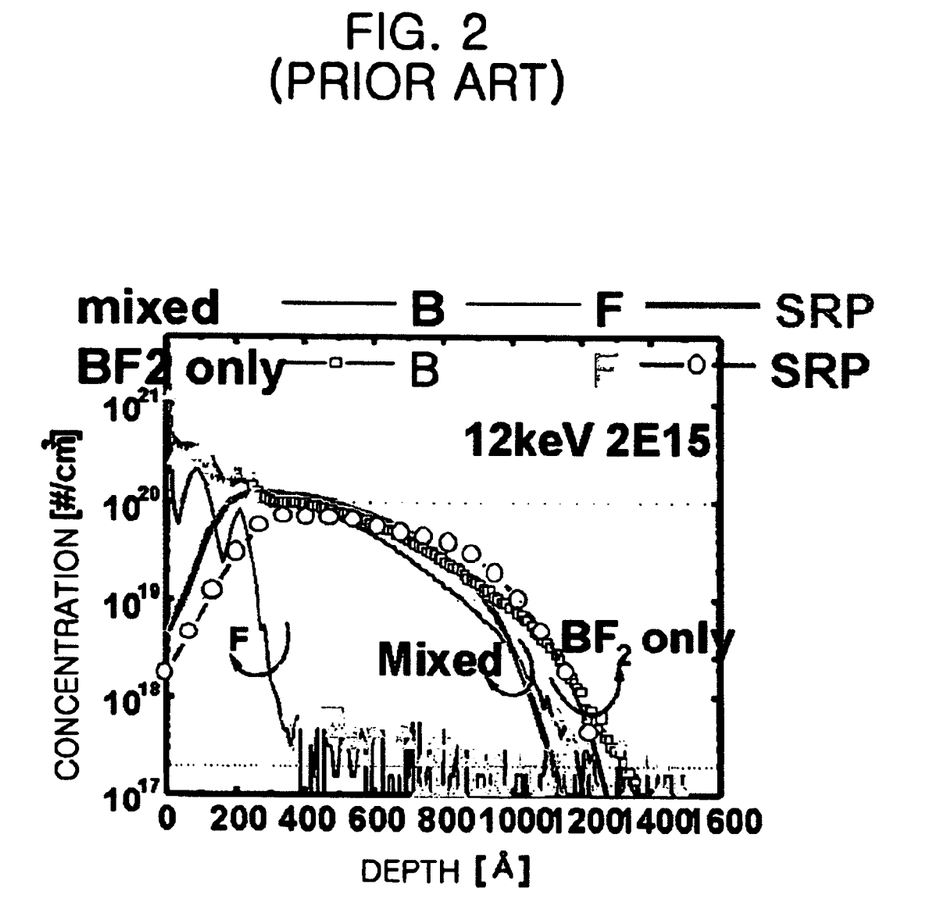
FIG. 2 is a characteristic diagram showing a dopant activation ratio dependence of on a dose of $^{19}F$.

Fluoride ions present in $^{49}BF_2$ contribute to the formation of shallow junctions by restraining transient enhanced diffusion (TED) of B ion. But too many fluoride ions can inhibit B ion activation and increase contact resistance. To address this problem, one can perform the ion implantation process in two steps. In the first step, one implants $^{49}BF_2$; in the second step, one implants B ion. This two step process, called double implantation, allows one to regulate the ratio of B to F ions, so that the B ions may be more precisely activated as compared to one-step processes, called single implantation, that implant B ion alone. FIG. 2 illustrates the influence of the ratio of B to F ion on dopant activation.

The total doses of B used can be made equal regardless of whether one uses double implantation or single implantation processes. However, the carrier spreading resistance profile (SRP), which contributes to a dopant activation, differs depending on which process is used. Where contacts are formed to a depth of 200 Å to 600 Å, the dose of BF2 and B ions, injected using double implantation, are over 1020 ions/cm². However, the dose of BF2 ion, injected by the single implantation, is about 3×1019 ions/cm² to about 5×1019 ions/cm² at equivalent depths.

Figure 3:
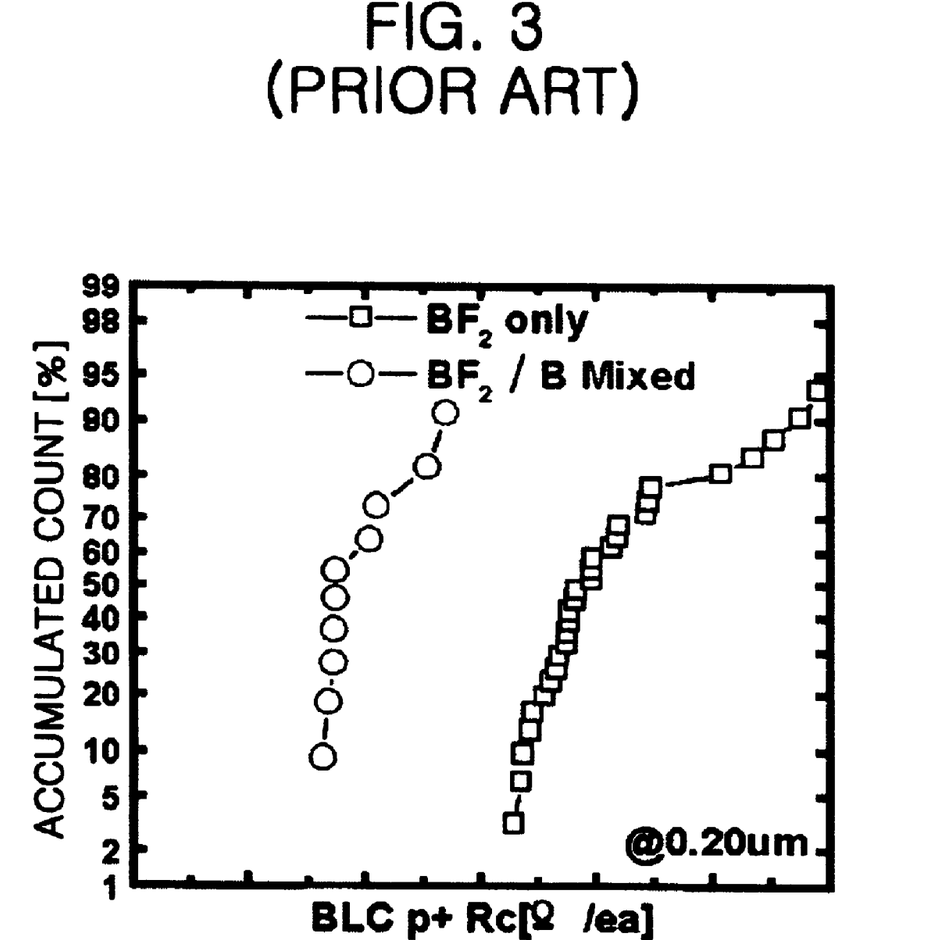
FIG. 3 is a characteristic diagram showing a contact resistance (Rc) variation according to a double implantation and a single implantation.

As is well known, one can form an ohmic contact with a dopant concentration of more than $10^{19}$ ions/cm². However, a field emission tunneling contact can be formed when the dopant concentration is over $10^{20}$ ions/cm². FIG. 3 is a graph representing a diagram characteristic of double and single implantation, showing resistance values measured at a contact having critical dimension of 0.2 μm, respectively. Therefore, as shown in the graphs of FIG. 3, a contact resistance(Rc) having smaller variation can be obtained.

In case of the double implantation, employing $^{11}B$ ion, which has smaller mass, the EOR defect is largely decreased compared with the implantation employing a $^{73}Ge$ ion.

Figure 4:
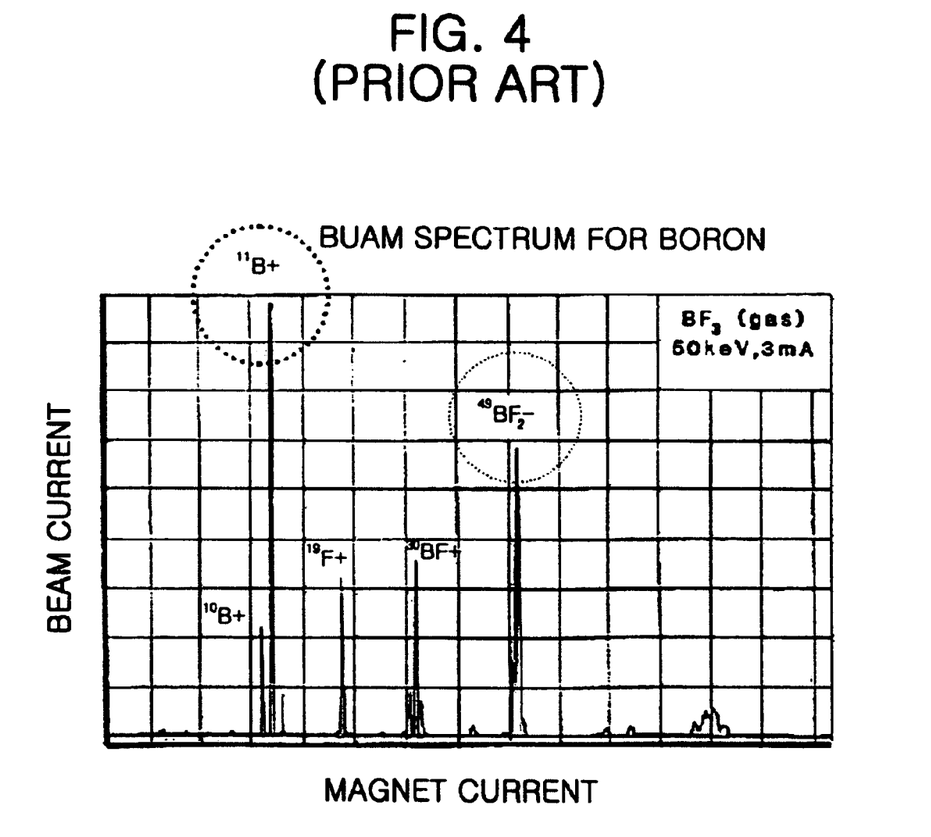
FIG. 4 is a diagram showing a beam spectrum of B.

Generally, a $BF_3$ gas is used for obtaining $BF_2$ or B. It is easier to ionize B than $BF_2$. FIG. 4 is a diagram which depicts a beam spectrum of B. If the ion implantation energy is the same (50 keV), a beam current of B ion is larger than that of $BF_2$ ion. Just for reference, when a $BF_3$ gas is decomposed, $^{11}B^+$, $^{10}B^+$, $^{19}F^+$, $^{30}BF^+$ and $^{49}BF_2^+$ are generated, and among them, $^{11}B^+$ and $^{10}B^+$ isotopes.

Figure 5:
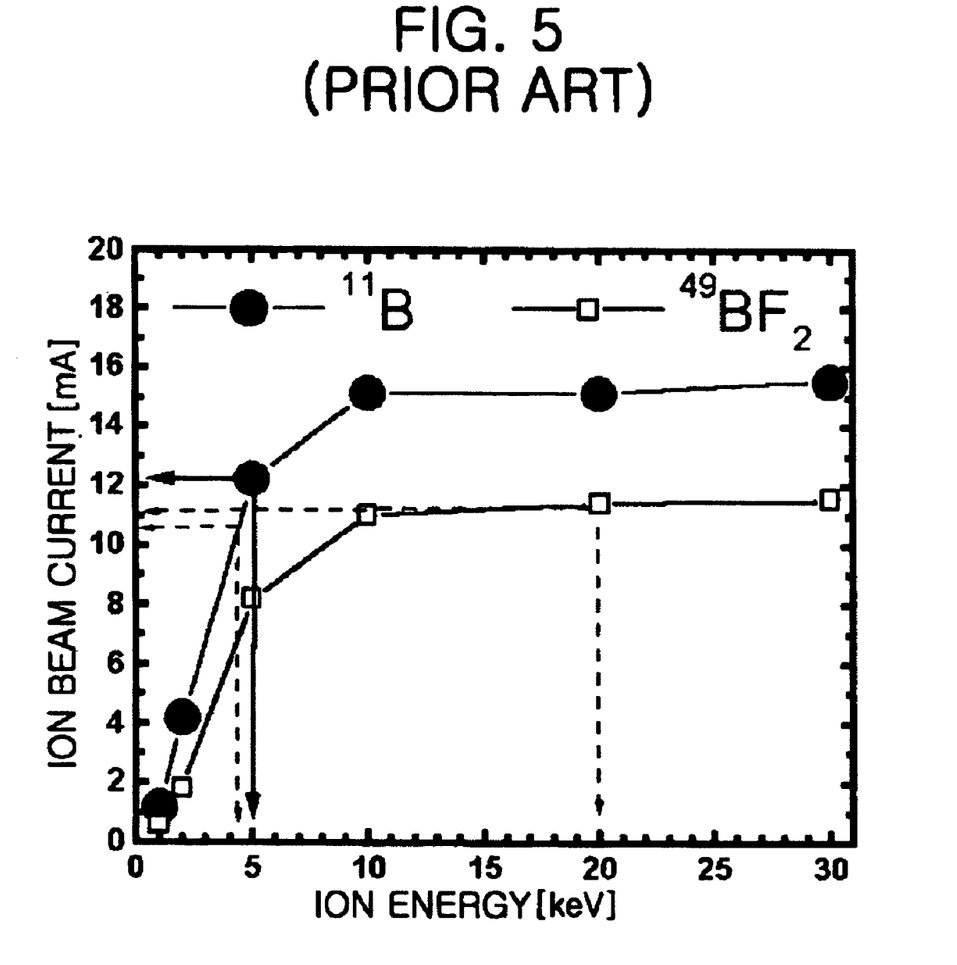
FIG. 5 is a characteristic diagram showing ion beam currents of $^{11}B$ and $^{49}BF_2$ according to the variation of ion implantation energy.

FIG. 5 is a graph showing ion beam current variation of $^{11}B^+$ and $^{49}BF_2^+$ according to ion implantation energy. The $^{49}BF_2^+$, ion implantation energy necessary for obtaining a shallow junction is usually from about 10 keV to about 20 keV, so $^{49}BF_2$ has high a ion beam current characteristic about 11 mA.

To obtain the same projection range (Rp) for $^{11}B$ as for $^{49}BF_2^+$ ion implantation, however, an ion implantation energy of from about 3 keV to about 4.5 keV is required. This is because ion implantation energy is proportional to mass ratio (a molecular ratio). In the above-mentioned range of the ion implantation energy, the beam current of $^{11}B$ ion rapidly decreases.

As mentioned above, double implantation produces improved contact resistance characteristics and lower EOR defects than single ion implantation, but at the cost of lower production yields. This is because the beam current of B ion is low when B ion is implanted with an energy in the range determined to form a shallow junction. Therefore, there remains a need in the art to provide a method of forming p-type source/drain regions in semiconductor devices by double implantation with improved productivity. The present invention meets these needs, among others.

SUMMARY OF THE INVENTION

The present invention provides an improved method for forming p-type source/drain regions in semiconductor devices. The method comprises implanting $BF_2$ ions and B ions in order using double implantation. The improved process provides enhanced productivity compared to known double implantation processes.

The present invention comprises: implanting a $BF_2$ ion in a p-type source/drain region on a silicon substrate with an ion implantation energy of from about 10 keV to about 20 keV; implanting B ion in the p-type source/drain region with an ion implantation energy of from about 5 keV to about 10 keV; and forming a p-type source/drain by carrying out a thermal treatment.

In the present invention, $^{49}BF_2$ ions and $^{11}B$ ions are implanted in order (i.e., using, double implantation). The $BF_2$ ions are implanted with an energy of from about 10 keV to about 20 keV. The B ions are implanted with an energy of from about 5 keV to about 10 keV. The B ions have the same projection range (Rp) as the $BF_2$ ions implanted with an energy of from about 3 keV to about 4.5 keV, when the B ions are implanted with an energy of from about 10 keV to about 20 keV. Advantageously, B ion may be implanted using a B element having a mass number of 11.

In the present invention, the B ions are implanted with the energy of from about 5 keV to about 10 keV, which is higher than that of standard ion implantation energy. Because the ion beam current is increased, productivity can be increased.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Hereinafter, a method for manufacturing semiconductor device capacitor according to the present invention will be described in detail, with occasional reference to the accompanying drawings.

Figure 6A:
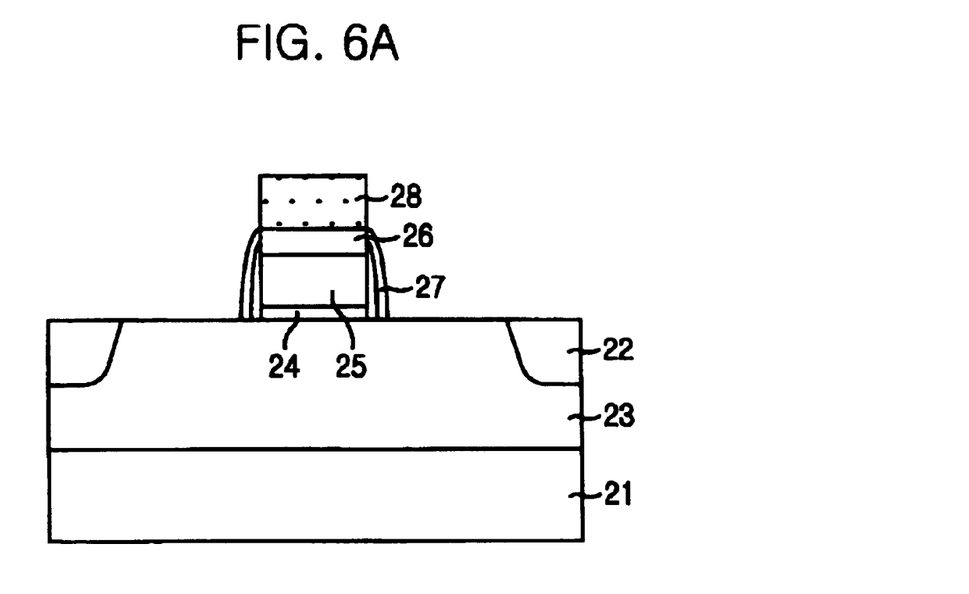
FIGS. 6A and 6B are cross-sectional views showing a method for manufacturing a transistor of a semiconductor device transistor according to an embodiment of the present invention.
Figure 6B:
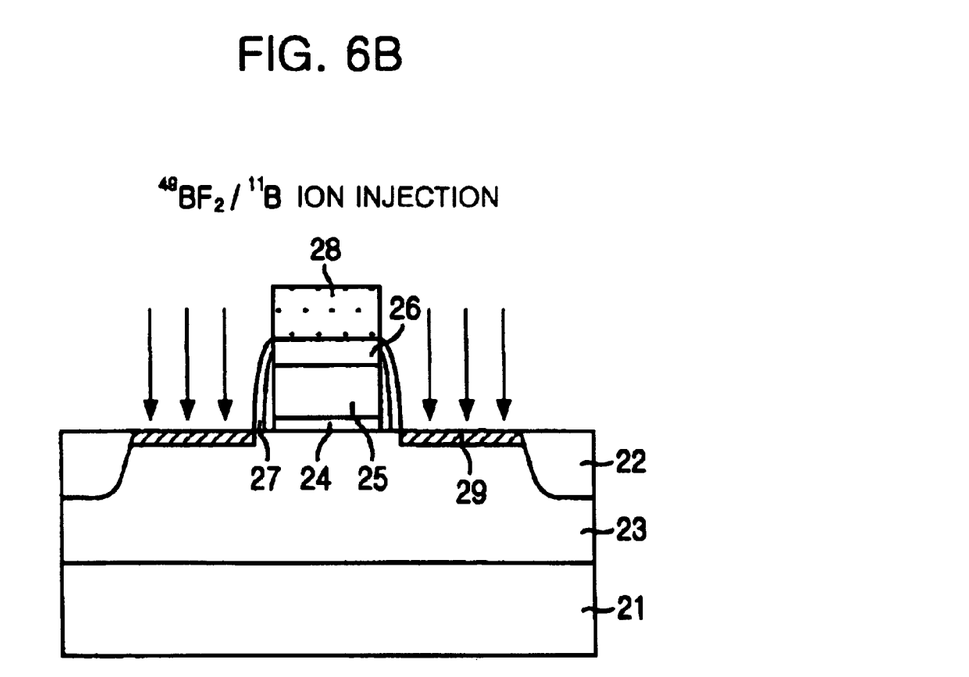

FIGS. 6A and 6B are cross-sectional views showing a method for manufacturing a transistor of a semiconductor device according to an embodiment of the present invention.

Referring to FIGS. 6A and 6B, a device isolation layer 22 is formed on a silicon substrate 21 using a trench isolation (STI) process. A p-well (not shown) and an n-well 23 are formed on the silicon substrate 21 through high energy ion implantation. Next, a gate oxide layer 24 and a gate electrode 25 are formed by carrying out a usual gate forming process. At this time, a mask oxide layer 26 is formed on an upper part of the gate electrode 25, and a spacer 27 consisting of an oxide layer and a nitride layer are formed on a sidewall of the gate electrode 25. In the figures, the reference numeral 28 denotes a photoresist pattern.

By increasing the thickness of the oxide layer and nitride layer for forming spacers 27 compared to that provided by the conventional method, it is possible to suppress punch-through problems caused by the reduction of resistance, namely caused by the improvement of the current characteristic($I_{dsat}$) obtained by the double implantation.

Referring to FIG. 6B, $^{49}BF_2$ ions and $^{11}B$ ions are implanted in order to form a source/drain region using the photoresist pattern 28 as an ion implantation mask. Subsequently, the photoresist pattern 28 is removed, and an ion implantation for forming $n^+$ source/drain, post processes are carried out. In FIG. 6B, reference numeral 29 shows $P^+$ source/drain formed through predetermined thermal process.

During implantation, ion implantation energies may be set to values allowing a shallow junction to be formed. In a preferred embodiment, the $^{49}BF_2$ ions may be implanted with an energy from about 5 keV to about 10 keV, and the $^{11}B$ ions (i.e., B ions having a mass number of 11) may be implanted with an energy of from about 5 keV to about 10 keV. $BF_2$ ions may be implanted at a dose of from about $1 \times 10^{15}$ ions/cm$^2$ to about $2 \times 10^{15}$ ions/cm$^2$. B ions may be implanted at a dose of from about $2 \times 10^{15}$ ions/cm$^2$ to about $1 \times 10^{15}$ ions/cm$^2$.

As mentioned above, in the present invention, the implantation energy is increased compared with the conventional implantation energy, (3 keV~4.5 keV), in proportion to mass ratio (molecular ratio) of $^{49}BF_2$. However, in case of a $^{11}B$ ion implantation, increasing the ratio of an ion implantation energy does not increase the depth of the $p^+$ source/drain junction. After much experimentation, the present inventors discovered that an energy in the range of from about 5 keV to about 10 keV optimal.

Figure 7:
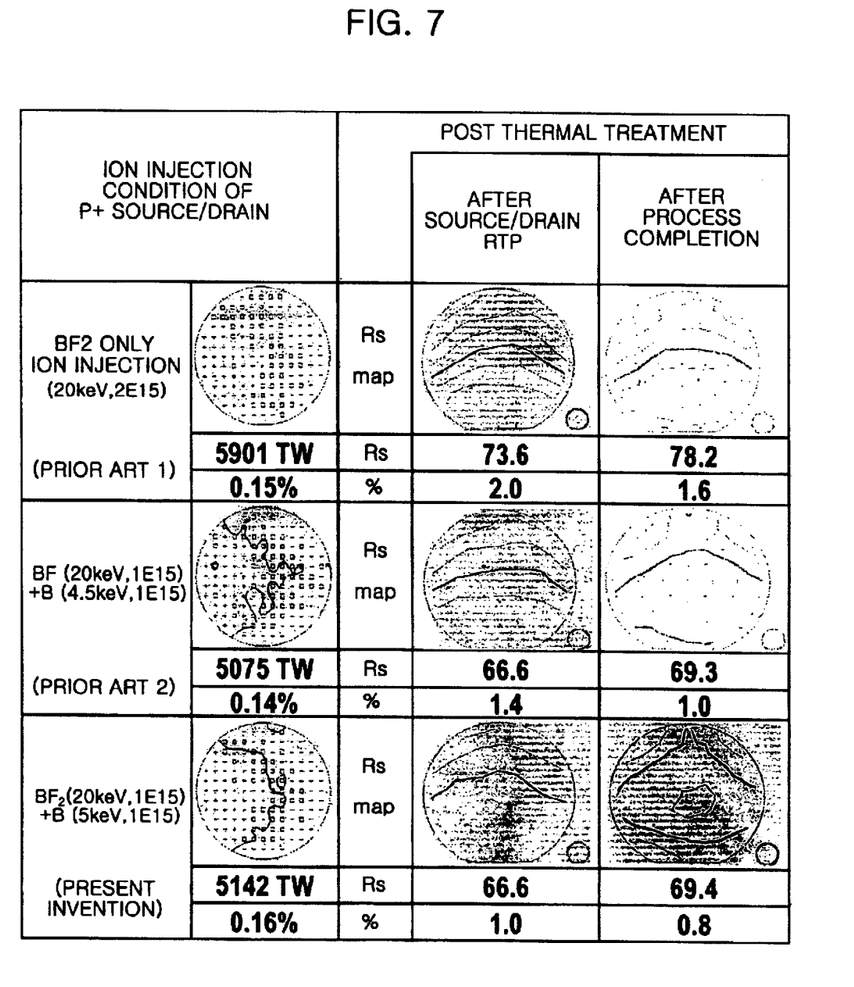
FIG. 7 is a diagram showing a surface resistance(Rs) value, Rs map, thermal wave(TW) value and a Rs value after post thermal treatment for forming a $p^+$ source/drain.

FIG. 7 is a diagram showing a surface resistance (Rs) value, Rs map, thermal wave(TW) value, and a Rs value after post thermal treatment for forming a $p^+$ source/drain.

FIG. 7 depicts a $p^+$ source/drain ion implantation process, which uses 20 keV of ion implantation energy and $2 \times 10^{15}$ ions/cm$^2$ of a dose condition (conventional technology 1), a $BF_2$ ion implantation, which uses 20 keV of ion implantation energy and $1 \times 10^{15}$ ions/cm$^2$ and a $p^+$ source/drain ion implantation, applying a B ion implantation, which uses 4.5 keV of ion implantation energy and $1 \times 10^{15}$ ions/cm$^2$ of a dose condition (conventional technology 2), and a $BF_2$ ion implantation uses 20 keV of ion implantation energy and $1 \times 10^{15}$ ions/cm$^2$ of a dose condition and a $p^+$ source/drain ion implantation, which applies B ion implantation uses 5.0 keV ion implantation energy and $1 \times 10^{15}$ ions/cm$^2$ of a dose condition (the present invention) carried out, respectively.

In addition, FIG. 7 shows a Rs map, Rs value and Rs equality, which are measured just after a source/drain rapid thermal treatment (RTP), which is carried out at a temperature of 1000° C. for about 10 seconds, and a Rs map, Rs value and Rs equality after the process (carrying out logs of thermal treatment after capacitor formation to thermal treatment), respectively.

Referring to FIG. 7, in case of the present invention, after a source/drain RTP process is completed, estimated Rs values are lower than the conventional technology 1 and similar to the conventional technology, respectively. For equal Rs, the present invention shows superior results than that of the conventional technologies 1 and 2. Also, when comparing TW values measured just after p+ source/drain ion implantation, the present invention provides TW values much lower than that of the conventional technology 1 and similar to that of the conventional technology 2. The above-mentioned results show that, when the present invention is applied, a defect characteristic by an ion implantation is much superior than that of the conventional technologies.

Figure 8:
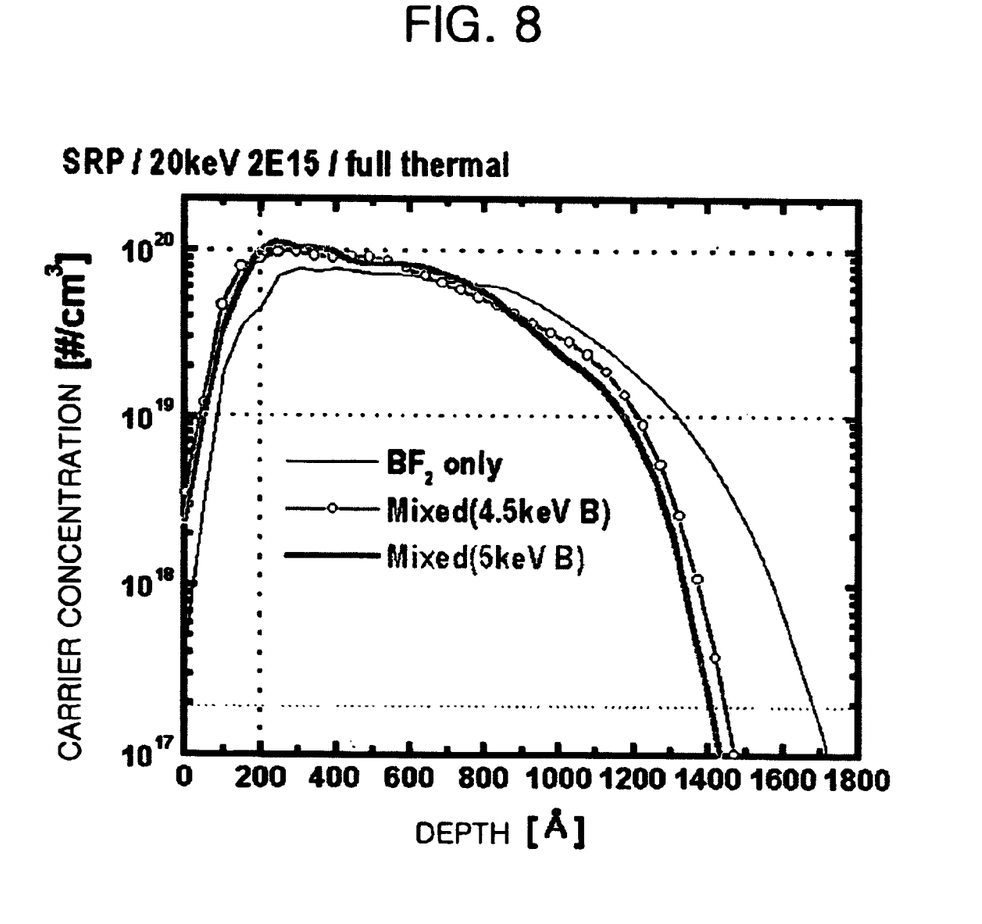
FIG. 8 is a characteristic diagram showing a spreading resistance profile (SRP) characteristic according to the three ion implantation conditions of FIG. 7.

FIG. 8 is a characteristic diagram showing a spreading resistance profile (SRP) characteristic according to the three ion implantation conditions of FIG. 7.

Referring to FIG. 8, a p+ source/drain ion implantation is carried out according to each condition, and shows a carrier concentration, which contributes to dopant activation according to a junction depth, measured after completion a device manufacturing process including lots of thermal treatment process.

The above-mentioned matters are numeralized and arranged in Table 1.

TABLE 1

| | Conventional technology 1 | Conventional technology 2 | The present invention |
|---|---|---|---|
| Junction depth [Å] (2E17 SRP) | 1680 | 1450 | 1400 |
| Carrier concentration peak value [ions/cm$^3$ [units?]] | 7.80 × 10$^{19}$ | 9.70 × 10$^{19}$ | 1.10 × 10$^{20}$ |
| Carrier concentration [ions/cm$^3$ [units?]] in a contact formation region (200Å) | 4.40 × 10$^{19}$ | 8.60 × 10$^{19}$ | 1.00 × 10$^{20}$ |

Referring to FIG. 8 and Table 1, when applying the present invention, a junction depth having 2×10$^{17}$ ions/cm$^2$ [supply units], which may be called as a surface concentration of a n-well and a p+ source/drain, is much lower than that of the conventional technology 1, and the junction depth has similar value to the conventional technology 2. Thus, the present invention allows a shallow junction to be maintained. Also, if the present invention is applied in a carrier concentration of a carrier concentration peak value and a carrier concentration in a contact formation region (200 Å) more than 10$^{20}$ [ions/cm$^2$ values, which may form a field emission tunneling contact formation, can be obtained.

When a BF$_2$/B mixed ion implantation is carried out in accordance with the present invention, increasing the ion beam current according to an ion implantation energy increasing of B, results in improved productivity. B ion implantation energy range (5 keV~10 keV), proposed by the present invention does not disturb the formation of a shallow junction. When a p+ source/drain ion implantation is carried out by applying the above-mentioned values, there is no loss in a defect characteristic or contact resistance characteristic.

The present invention increases productivities while maintaining the contact resistance reducing effect and the end of range (EOR) defect reducing effects obtained in $^{49}$BF$_2$/$^{11}$B mixed ion implantation. When an ion implantation process is carried out in a current production line, if an ion beam current is increased about 1 mA, processing time over 1 minute is decreased on the bases of 3 sheets of wafer, so the present invention is expected to contribute to increased production. The present invention also reduces contact resistanceover levels obtainable using conventional $^{49}$BF$_2$/$^{11}$B ion implantation processes, thus simplifying the process and eliminating the need for an additional dopant ion implantation process after opening contact.

Although the preferred embodiments of the invention have been disclosed for illustrative purposes, those skilled in the art will appreciate that various modifications, additions and substitutions are possible, without departing from the scope and spirit of the invention as set forth in the accompanying claims.

What is claimed is:

1. A method for manufacturing a semiconductor device, comprising steps of:

a) implanting BF$_2$ ions with a dose of about 1×10$^{15}$ ions/cm$^2$ in a p-type source/drain region on a silicon substrate with an ion implantation energy ranging from about 10 keV to about 20 keV;

b) implanting B ions with a dose of about 2×10$^{15}$ ions/cm$^2$ in the p-type source/drain region with ion implantation energy ranging from about 5 keV to about 10 keV after the implanting BF$_2$ ions; and c) thermally treating the BF$_2$/B ions implanted source/drain region to activate the BF$_2$ and B ions.

2. The method of claim 1, wherein said B ions have a mass number of 11.

* * * * *